United States Patent
Rai

(10) Patent No.: US 11,626,532 B2
(45) Date of Patent: Apr. 11, 2023

(54) METHODS AND APPARATUS FOR FORMING LIGHT EMITTING DIODES

(71) Applicant: APPLIED MATERIALS, INC., Santa Clara, CA (US)

(72) Inventor: Shiva Rai, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 213 days.

(21) Appl. No.: 17/142,752

(22) Filed: Jan. 6, 2021

(65) Prior Publication Data

US 2022/0216363 A1 Jul. 7, 2022

(51) Int. Cl.
*H01L 33/00* (2010.01)
*H01L 33/04* (2010.01)

(52) U.S. Cl.
CPC ...... *H01L 33/0075* (2013.01); *H01L 33/0095* (2013.01); *H01L 33/04* (2013.01)

(58) Field of Classification Search
CPC .............. H01L 33/007; H01L 33/0075; H01L 33/0095; H01L 33/04
See application file for complete search history.

(56) References Cited

U.S. PATENT DOCUMENTS

| | | | |
|---|---|---|---|
| 7,160,747 B2 | 1/2007 | Haberern et al. | |
| 8,222,658 B2 | 7/2012 | Shinagawa et al. | |
| 8,455,880 B2 | 6/2013 | Park et al. | |
| 9,728,679 B2 | 8/2017 | Dechoux et al. | |
| 10,128,636 B2 | 11/2018 | Gerlach et al. | |
| 2019/0319429 A1* | 10/2019 | Ledentsov | H01S 5/141 |
| 2021/0399173 A1* | 12/2021 | Choi | H01L 33/30 |

OTHER PUBLICATIONS

Matthew R. Peart, Xiongliang Wei, Damir Borovac, Wei Sun, Nelson Tansu, and Jonathan J. Wierer, Jr., Thermal Oxidation of AlInN for III-Nitride Electronic and Optoelectronic Devices, Jul. 12, 2019, pp. 1367-1371, American Chemical Society.

* cited by examiner

*Primary Examiner* — Matthew C Landau
*Assistant Examiner* — Dmitriy Yemelyanov
(74) *Attorney, Agent, or Firm* — Moser Taboada

(57) ABSTRACT

A method for forming a light emitting diode (LED) uses aluminum-based material layers and oxidation during the LED formation. In some embodiments, the method may include forming an n-type layer of the LED on a substrate, forming at least one sidewall restriction layer of the LED on the substrate with the sidewall restriction layer comprising an aluminum-based material, forming a quantum well layer of the LED on the substrate, forming a p-type layer of the LED on the substrate, exposing the substrate to water vapor, and heating the substrate to oxidize at least an outer portion of the electron blocking layer. The aluminum-based material may include aluminum indium nitride or aluminum gallium arsenide.

20 Claims, 7 Drawing Sheets

METHODS AND APPARATUS FOR FORMING LIGHT EMITTING DIODES

FIELD

Embodiments of the present principles generally relate to semiconductor manufacturing.

BACKGROUND

Light emitting diodes (LEDs) can be used for many applications. One popular application is to use LEDs as display pixels to generate images by altering the emitted frequency or wavelength of the pixel. To increase the resolution of the image, the pixel sizes must be reduced while increasing pixel performance. With decreased dimensions, the typical manufacturing processes are unable to keep up with the increased demands on display resolutions. Accordingly, the inventor has provided methods for forming LEDs that allow for increased performance regardless of the size of the LEDs, leading to superior performance.

SUMMARY

Methods and apparatus for forming light emitting diodes (LEDs) are provided herein.

In some embodiments, a method for forming a light emitting diode (LED) may comprise forming an n-type layer on a substrate, forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation, forming a quantum well layer of the LED on the substrate, forming a p-type layer of the LED on the substrate, exposing the substrate to water vapor, and heating the substrate to selectively oxidize at least an outer portion of the at least one sidewall restriction layer to increase the quantum efficiency of the LED.

In some embodiments, the method may further include forming the p-type layer as a first superlattice including at least one first aluminum-based material layer and selectively oxidizing at least a first outer portion of the first aluminum-based material layer of the first superlattice to form a first one of the at least one sidewall restriction layer, wherein the first superlattice includes at least one p-type aluminum indium nitride layer and at least one gallium nitride layer, wherein the first superlattice includes at least one p-type aluminum gallium arsenide layer and at least one gallium arsenide layer, forming the n-type layer as a second superlattice including at least one second aluminum-based material layer and selectively oxidizing at least a second outer portion of the second aluminum-based material layer of the second superlattice to form a second one of the at least one sidewall restriction layer, wherein the second superlattice includes at least one n-type aluminum indium nitride layer and at least one gallium nitride layer, wherein the second superlattice includes at least one n-type aluminum gallium arsenide layer and at least one gallium arsenide layer, wherein the quantum well layer incudes a multi-quantum well (MQW), wherein the at least one sidewall restriction layer of an aluminum-based material is formed on the n-type layer, wherein the at least one sidewall restriction layer of the aluminum-based material is formed on the quantum well layer and is additionally configured to function as an electron blocking layer, heating the substrate to a temperature of approximately 500 degrees Celsius to approximately 800 degrees Celsius, and/or exposing the substrate to water vapor in a nitrogen ambient for a duration of approximately 30 seconds to approximately 600 seconds.

In some embodiments, a method for forming a light emitting diode (LED) may comprise forming an n-type layer of the LED on a substrate, forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation, forming a quantum well layer of the LED on the substrate, forming a p-type layer of the LED on the substrate, exposing the substrate to water vapor in a nitrogen ambient for approximately 30 seconds to approximately 600 seconds, and heating the substrate to a temperature of approximately 500 degrees Celsius to approximately 800 degrees Celsius to selectively oxidize at least an outer portion of the at least one sidewall restriction layer to increase the quantum efficiency of the LED.

In some embodiments, the method may further include forming the p-type layer as a first superlattice including at least one first aluminum-based material layer and selectively oxidizing at least a first outer portion of the first aluminum-based material layer of the first superlattice to form a first one of the at least one sidewall restriction layer, wherein the first superlattice includes at least one p-type aluminum indium nitride layer and at least one gallium nitride layer or includes at least one p-type aluminum gallium arsenide layer and at least one gallium arsenide layer, forming the n-type layer as a second superlattice including at least one second aluminum-based material layer and selectively oxidizing at least a second outer portion of the second aluminum-based material layer of the second superlattice to form a second one of the at least one sidewall restriction layer, wherein the second superlattice includes at least one n-type aluminum indium nitride layer and at least one gallium nitride layer or includes at least one n-type aluminum gallium arsenide layer and at least one gallium arsenide layer, and/or wherein the at least one sidewall restriction layer of an aluminum-based material is formed on the n-type layer or formed on the quantum well layer.

In some embodiments, a non-transitory, computer readable medium having instructions stored thereon that, when executed, cause a method for forming a light emitting diode (LED) to be performed, the method may comprise forming an n-type layer of the LED on a substrate, forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation, forming a quantum well layer of the LED on the substrate, forming a p-type layer of the LED on the substrate, exposing the substrate to water vapor in a nitrogen ambient for approximately 30 seconds to approximately 600 seconds, and heating the substrate to a temperature of approximately 500 degrees Celsius to approximately 800 degrees Celsius to selectively oxidize at least an outer portion of the at least one sidewall restriction layer to increase the quantum efficiency of the LED.

In some embodiments, the method may further include wherein the at least one sidewall restriction layer of the aluminum-based material is formed on the n-type layer or formed on the quantum well layer.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
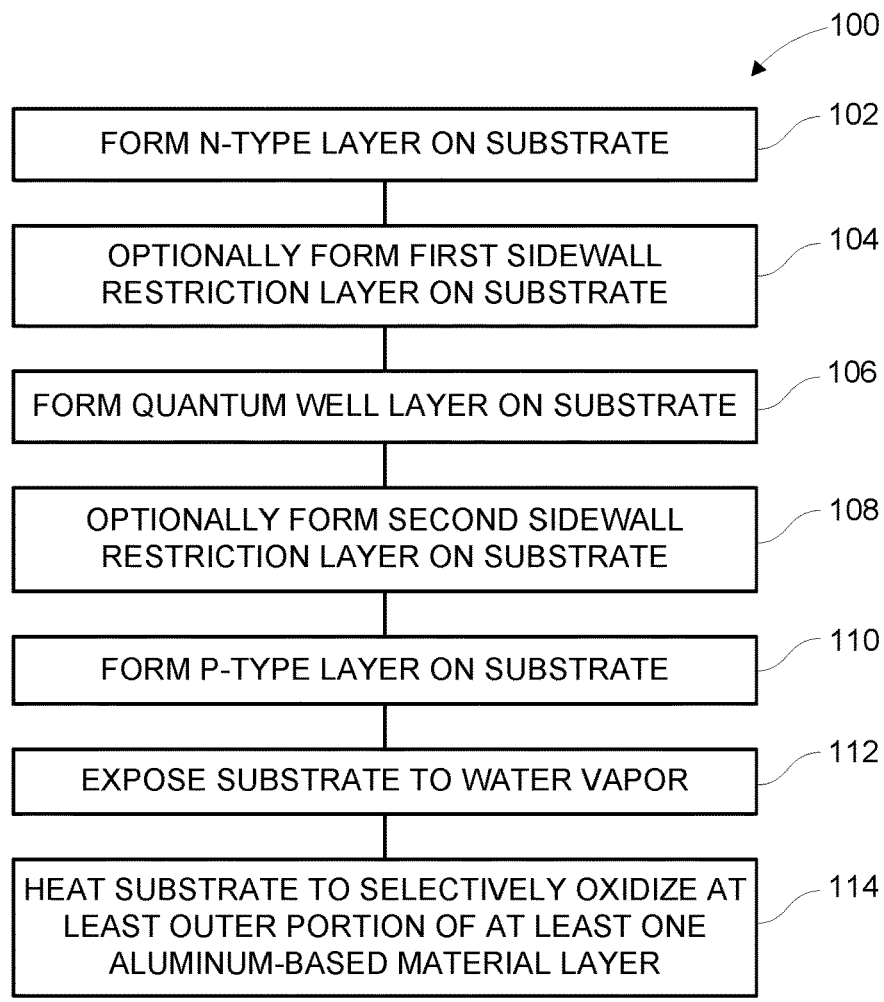
FIG. 1 is a method of forming light emitting diodes (LEDs) in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus enable formation of light emitting diodes (LEDs) such as emitters or display pixels and the like with improved performance and scalability. Specific epilayers that are used within the LED structures are unique to the given techniques. Sidewall effects on the carrier injection and recombination phenomenon are isolated in the given LED structures. In addition, current flow restrictions are created that increase current densities and performance of the LED structures. The unique restricted current flow paths of the LEDs resulting from the lateral oxidation assist in addressing the reduction of quantum efficiencies in LEDs structures with decreasing die size. Current flow restriction is typically accomplished by physical isolation or by implant. Scaling down of LEDs has a negative impact on the external quantum efficiency (EQE) of the device where the sidewall damages dominate the carrier recombination mechanisms. The current approach to address the surface states created by reactive-ion etching (RIE) is to use passivation layers deposited either by plasma enhanced chemical vapor deposition (PECVD) or atomic layer deposition (ALD). The defects caused by the RIE process act as charge states that trap carriers causing a reduction in both injection and recombination efficiencies. The conventional method of alleviating the effect is by passivating the sidewalls using dielectric films. The deposition process for dielectrics is usually plasma-based and is typically non-conforming and can be further detrimental to the surfaces. The methods of the present principles are advantageously applicable to both gallium nitride (GaN)-based and gallium arsenide (GaAs)-based LED structures. The lateral oxidation approach will have an EQE benefit irrespective of the die size, geometry, or material system. The EQE performance is also potentially independent of the RIE etch conditions and the type of passivation layer used. The lateral oxidation approach will naturally create higher current densities that can push the EQE of the LED towards peak values, especially in microLEDs.

In some embodiments, after a mesa etch is completed on an LED wafer, the wafers are loaded into a planetary thermal furnace. The wafers are subjected to heated water vapor in a nitrogen gas ($N_2$) ambient. The nitrogen gas ambient aids in uniformity of the water vapor film on the substrate. The layers of the LED structure with high aluminum (Al) composition (the "sidewall restriction layers") will start oxidizing laterally from the mesa sidewalls, creating aluminum gallium oxide ($Al_xGa_yO_z$) or aluminum indium oxide ($Al_xIn_yO_z$). The oxidation rate depends on the aluminum composition and also the process conditions. The aluminum percentage in sidewall restriction layers, located above and/or below multi-quantum wells (MQWs), can be intentionally higher to increase the oxidation rate and thereby define the active area of the device. In addition, the outer oxidized portion of the epilayer is electrically insulating and will not conduct current, thereby pushing the current flow away from the sidewalls. The lateral oxidation of the aluminum-based material layer will eliminate carrier trapping and recombination at the defect sites at the sidewalls. The chamber design for the oxidation furnace can be a single wafer or a batch wafer furnace. Since the oxidation rate is very sensitive to the aluminum percentage, and there is an inherent run-to-run drift in aluminum percentage in a metal organic chemical vapor deposition (MOCVD) process, the progression of the lateral oxidation may be monitored in-situ. The monitoring can be done using optical microscopy built into the chamber ceiling. For throughput and uniform oxidation (within wafer and wafer-to-wafer), a planetary chamber configuration where both the susceptor and the wafers rotate may be used. After the lateral oxidation is completed, the device processing can continue with the standard process flow steps, like passivation and metal contacts.

An LED emits incoherent light with a particular wavelength (color) as a consequence of charge carrier recombination across a P-N junction. During etching of the LED structures, the sidewalls contain defects that directly impact the efficiency of the charge carrier recombination process, reducing light output. The defects cause carriers to non-radiatively recombine, causing a 'leaky,' or low performing LED with diminished light output. A traditional passivation layer deposited after etching does not dramatically reduce the amount of defects caused by the etching process. The effects of the sidewall defects increase substantially and become the dominant performance drain as the size of the LED die shrinks from several millimeters to a micron or sub-micron die size (microLEDs). The inventor has discovered that the affect of the sidewall defects can be avoided by forcing the carriers in the LED structure away from the sidewalls so that the carriers do not "see" the defects on the sidewalls. The inventor has found that by electrically creating a very resistive material that the carriers would avoid, if possible, the carriers will take the shortest, least resistive path. By having the resistive material on the sides of the LED structure, the carriers are forced away from the sidewall defects, improving the quantum efficiency. The inventor has found that restricting carrier movement from the sidewalls may be accomplished using a single "sidewall restriction" layer or multiple "sidewall restriction" layers (that further increase the quantum efficiency) within the LED structure that are laterally oxidized to increase electrical resistance at the sidewalls of the LED structure. The number of laterally oxidized layers may be adjusted to compensate for the severity of the defects that result from plasma-based etching processes (more layers for more severe defects and higher quantum efficiency).

In FIG. 1, a method 100 of forming an LED structure is discussed in reference to FIGS. 2-12. In block 102, an N-type layer 204 is formed on a substrate 202 as shown in a view 200 of FIG. 2. An N-type layer 204 is a material that has been doped to increase the amount of free electrons to enhance the conductivity of the material. In some embodiments, the N-type layer 204 may be formed from gallium nitride (GaN) or gallium arsenide (GaAs) and the like. After further etching processes discussed below, first contacts 214 may be formed on the N-type layer 204. In some embodiments, a portion of the N-type layer 204 may be formed as an aluminum-based material layer that may be laterally oxidized to form a sidewall restriction layer (see FIG. 5 discussed below).

Figure 2:
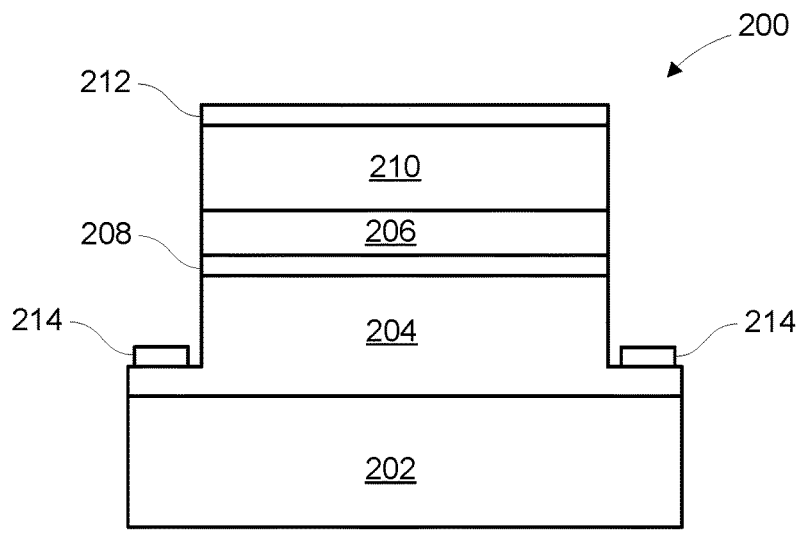
FIG. 2 depicts a cross-sectional view of an LED structure with a sidewall restriction layer below a quantum well in accordance with some embodiments of the present principles.
Figure 3:
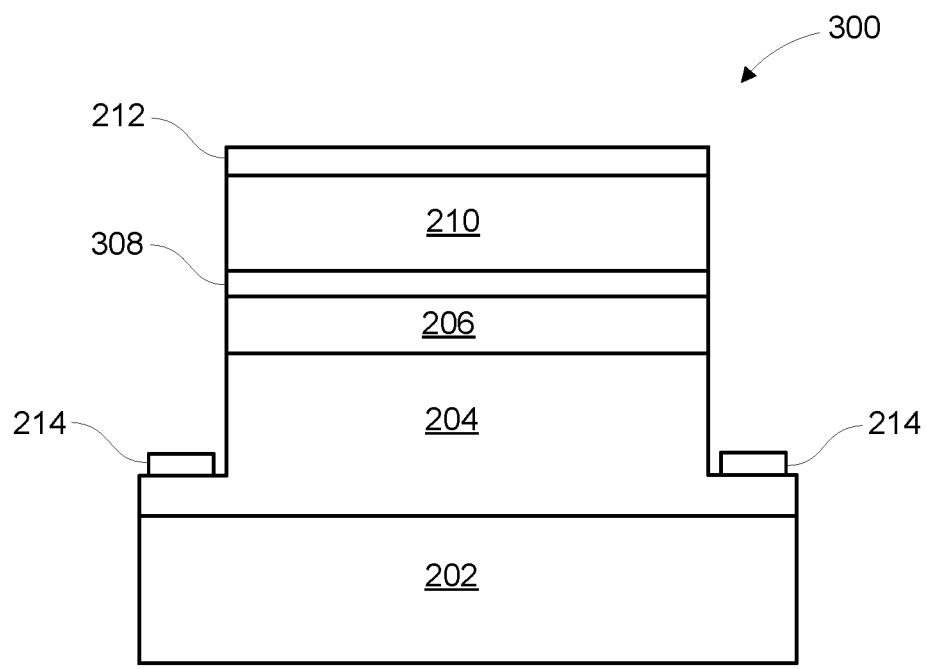
FIG. 3 depicts a cross-sectional view of an LED structure with a sidewall restriction layer above a quantum well in accordance with some embodiments of the present principles.
Figure 4:
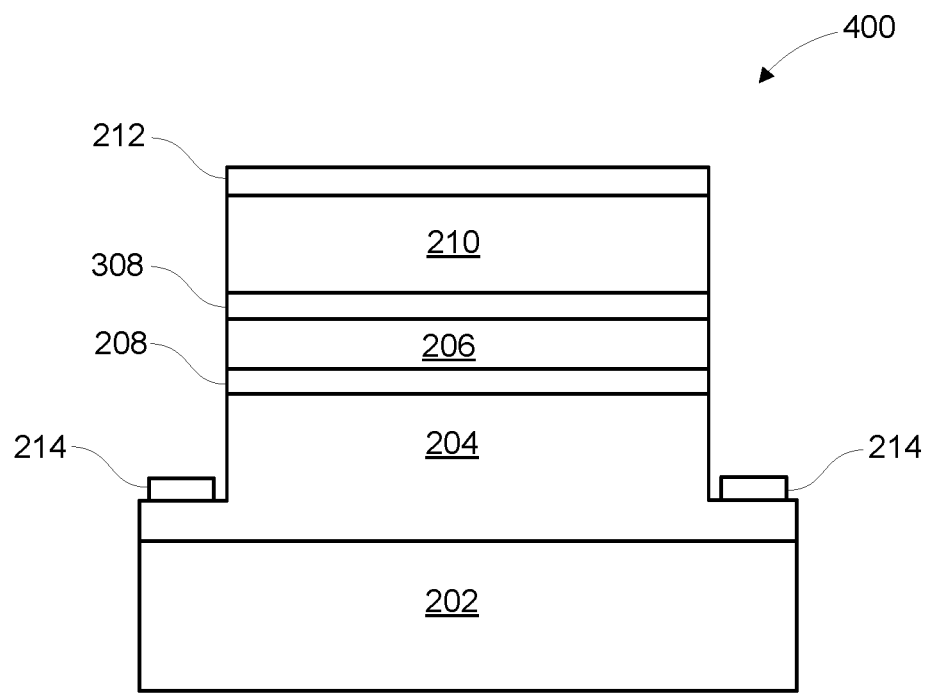
FIG. 4 depicts a cross-sectional view of an LED structure with a first sidewall restriction layer above and a second sidewall restriction layer below a quantum well in accordance with some embodiments of the present principles.
Figure 5:
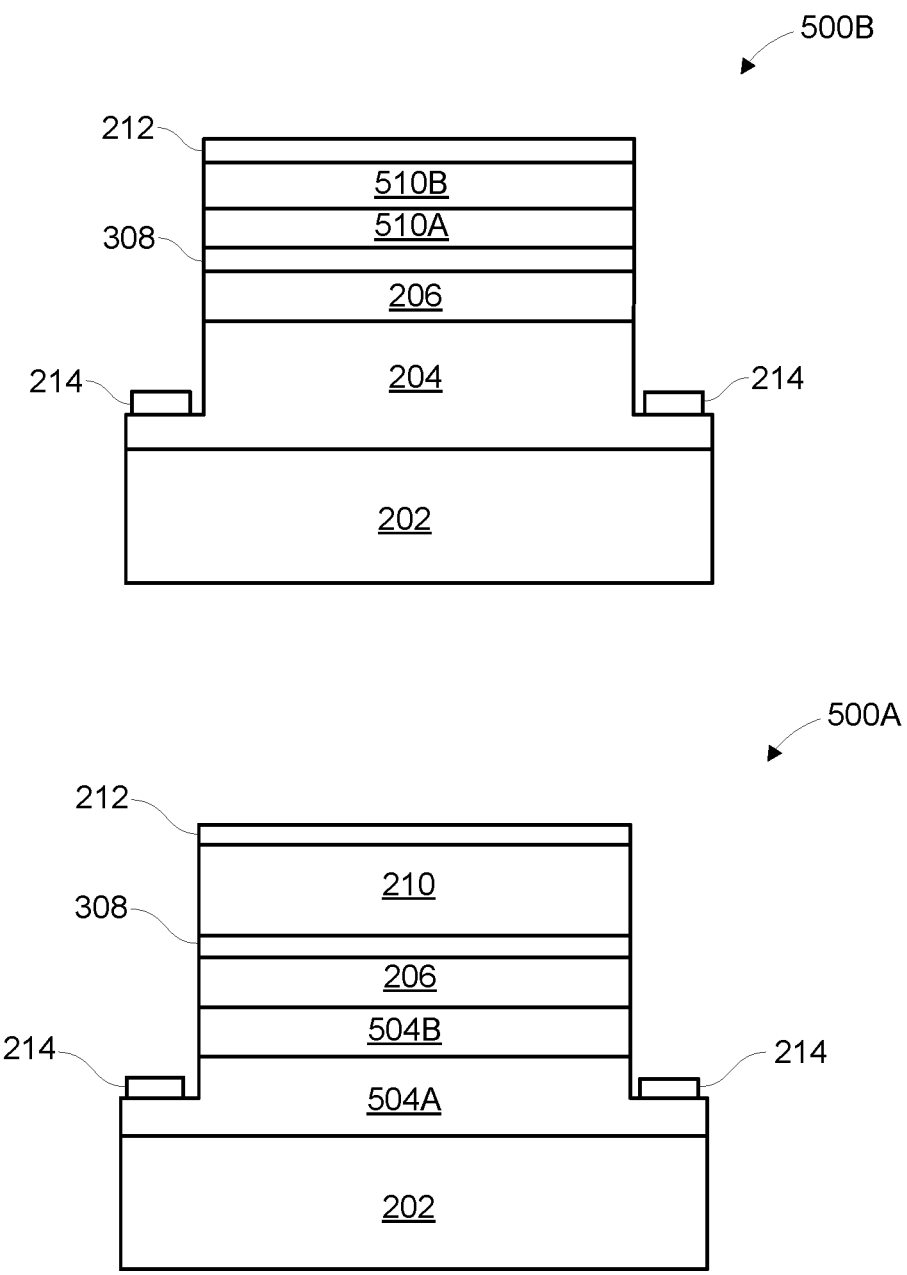
FIG. 5 depicts cross-sectional views of LED structures with a superlattice in accordance with some embodiments of the present principles.
Figure 6:
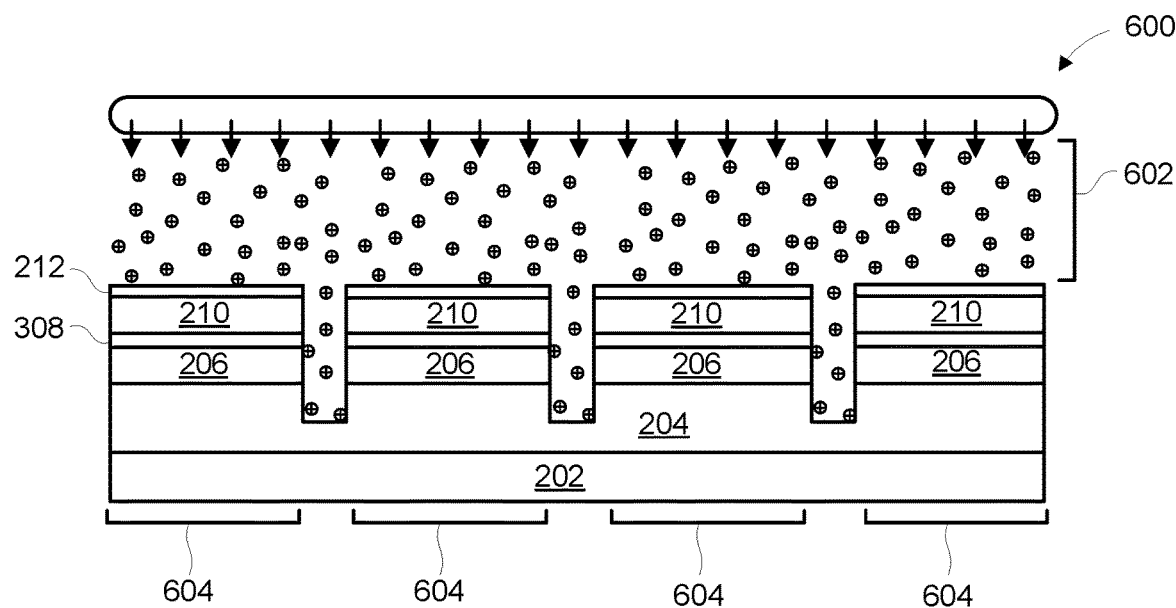
FIG. 6 depicts a cross-sectional view of LED structures in an oxidation environment in accordance with some embodiments of the present principles.

In block 104, a first sidewall restriction layer 208 may be optionally formed on the N-type layer 204 as depicted in a view 200 of FIG. 2. The first sidewall restriction layer 208 is optional in the sense that a sidewall restriction layer may be formed prior to or after the formation of the quantum well layer 206 (see FIG. 3) or both prior to and after the formation of the quantum well layer 206 (see FIG. 4). The first sidewall restriction layer 208 may also function as a hole blocking layer for the LED structure. A hole blocking layer reduces hole leakage from the quantum well layer 206 into the N-type layer 204 when formed under the quantum well layer 206. In the method 100, the first sidewall restriction layer 208 is formed from an aluminum-based material that can be laterally oxidized during subsequent selective oxidation processes. The first sidewall restriction layer 208 functions to move carriers away from the sidewalls of the LED structure to avoid sidewall defects, increasing the LED structure's quantum efficiency. The aluminum-based material used in the first sidewall restriction layer 208 may be aluminum indium nitride ($Al_xIn_{1-x}N$) or aluminum gallium arsenide ($Al_xGa_{1-x}As$). The percentage of aluminum may vary based on the lattice mismatch of in the LED structure, the amount of oxidation required (lateral penetration into the layer to reduce the effects of the sidewall defects), and/or an amount of time available for processing (higher content of aluminum allows for faster oxidation processes). In some embodiments, the percentage of aluminum may be from approximately 20 percent to approximately 70 percent.

In block 106, a quantum well layer 206 is formed. The quantum well layer 206 may be formed on an optionally formed first sidewall restriction layer 208 as in FIG. 2 or on the N-type layer 204 as depicted in a view 300 of FIG. 3. In some embodiments, the quantum well layer 206 may comprise a multi-quantum well (MQW) layer. The quantum well layer 206 is the potential well or active region of the LED structure. In block 108, a second sidewall restriction layer 308 may be optionally formed on the quantum well layer 206 as depicted in a view 300 of FIG. 3. The second sidewall restriction layer 308 is optional in the sense that a sidewall restriction may be formed prior to or after the formation of the quantum well layer 206 or both prior to and after the formation of the quantum well layer 206 (as depicted in a view 400 of FIG. 4 which shows both the first sidewall restriction layer 208 and the second sidewall restriction layer 308 in the LED structure). The second sidewall restriction layer 308 may also function as an electron blocking layer for the LED structure. An electron blocking layer reduces electron leakage from the quantum well layer 206 into the P-type layer 210 when formed on the quantum well layer 206.

In the method 100, the second sidewall restriction layer 308 is formed from an aluminum-based material that can be laterally oxidized during subsequent selective oxidation processes. The second sidewall restriction layer 308 functions to move carriers away from the sidewalls of the LED structure to avoid sidewall defects, increasing the LED structure's quantum efficiency. The aluminum-based material of the second sidewall restriction layer 308 may be aluminum indium nitride ($Al_xIn_{1-x}N$) or aluminum gallium arsenide ($Al_xGa_{1-x}As$). The percentage of aluminum may vary based on the lattice mismatch of in the LED structure, the amount of oxidation required (lateral penetration into the layer to reduce the effects of the sidewall defects) and/or an amount of time available for processing (higher content of aluminum allows for faster oxidation processes). In some embodiments, the percentage of aluminum may be from approximately 20 percent to approximately 70 percent.

In block 110, a P-type layer 210 is formed on the substrate 202 as shown in FIGS. 2-8, 11, and 12. The P-type layer 210 comprises a material that has been doped to create a deficiency of valence electrons or holes. In some embodiments, the P-type layer 210 may be formed from gallium nitride (GaN) or gallium arsenide (GaAs) and the like. In some embodiments, a portion of the P-type layer 210 may be formed as an aluminum-based material layer that may be laterally oxidized to form a sidewall restriction layer (see FIG. 5 discussed below). A second contact 212 may be formed on the P-type layer 210. In block 112, the substrate 202 is exposed to water vapor as depicted in a view 600 of FIG. 6. In some embodiments, the water vapor 602 may also include a nitrogen gas ambient. In the view 600 of FIG. 6, the substrate 202 is shown with the LED structure layers already formed and after an etching process which created the isolated LED structures 604.

Figure 7:
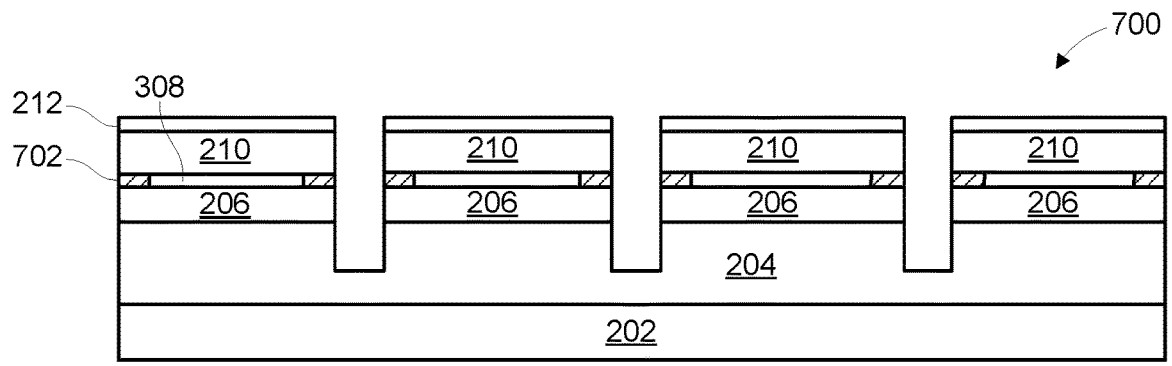
FIG. 7 depicts a cross-sectional view of LED structures after an oxidation process in accordance with some embodiments of the present principles.
Figure 8:
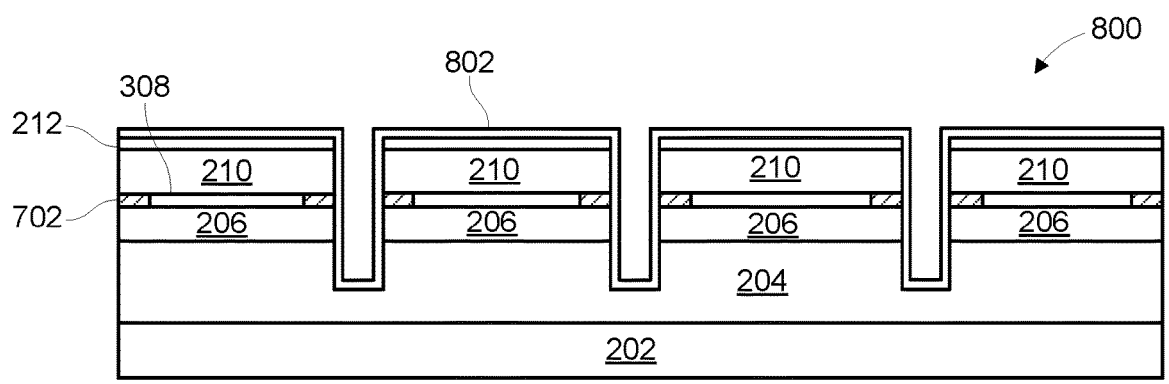
FIG. 8 depicts a cross-sectional view of LED structures after a passivation process in accordance with some embodiments of the present principles.

In block 114, the substrate 202 is heated to selectively oxidize at least an outer portion of an aluminum-based material layer. The combination of the heat and exposure to water vapor causes the aluminum in an aluminum-based material layer to laterally oxidize from the sidewall of an LED structure inward as depicted in a view 700 of FIG. 7. In the example of FIG. 7, the second sidewall restriction layer 308 has an outer portion 702 which has been oxidized to restrict the carriers from defects in the sidewalls of the LED structure. In some embodiments, the substrate 202 may be exposed to water vapor and heated for approximately 30 seconds to approximately 600 seconds at a temperature of approximately 500 degrees to approximately 800 degrees. As depicted in a view 800 of FIG. 8, a passivation layer 802 may then be formed over the LED structures using PECVD or ALD processes. One of the further advantages of the method 100 is that the passivation layer 802 is less critical due to the removal of carriers near the defects in the sidewalls of the LED structures. Faster deposition processes such as PECVD may be used for the passivation layer deposition over the slower, but higher quality ALD conformal deposition processes.

Additional sidewall restriction layers may be formed within the LED structure by leveraging superlattice structures within the N-type layer 204. A superlattice has multiple layers of materials with differences in bandgaps between the materials. An additional third sidewall restriction layer 504B may be formed as a superlattice structure and combined with a reduced N-type layer 504A to function as the N-type layer 204 as depicted in a view 500A of FIG. 5. For example, an n-$Al_xIn_{1-x}$N/GaN superlattice structure (third sidewall restriction layer 504B) may be formed in conjunction with an n-GaN layer as the N-type layer 204. Similarly, an n-$Al_xGa_{1-x}$As/GaAs superlattice structure (third sidewall restriction layer 504B) may be formed in conjunction with an n-GaAs layer as the N-type layer 204. The introduction of aluminum into the superlattice structure provides an aluminum-based material layer that can be laterally oxidized to restrict carriers from the sidewalls of the LED structure.

In a similar fashion, another additional sidewall restriction layer may be formed within the LED structure by leveraging superlattice structures within the P-type layer 210. A superlattice has multiple layers of materials with differences in bandgaps between the materials. An additional fourth sidewall restriction layer 510B may be formed as a superlattice structure and combined with a reduced P-type layer 510A to function as the P-type layer 210 as depicted in a view 500B of FIG. 5. For example, a p-$Al_xIn_{1-x}$N/GaN superlattice structure (fourth sidewall restriction layer 510B) may be formed in conjunction with a p-GaN layer as the P-type layer 210. Similarly, a p-$Al_xGa_{1-x}$As/GaAs superlattice structure (fourth sidewall restriction layer 510B) may be formed in conjunction with a p-GaAs layer as the P-type layer 210. The introduction of aluminum into the superlattice structure provides an aluminum-based material layer that can be laterally oxidized to restrict carriers from the sidewalls of the LED structure.

Figure 12:
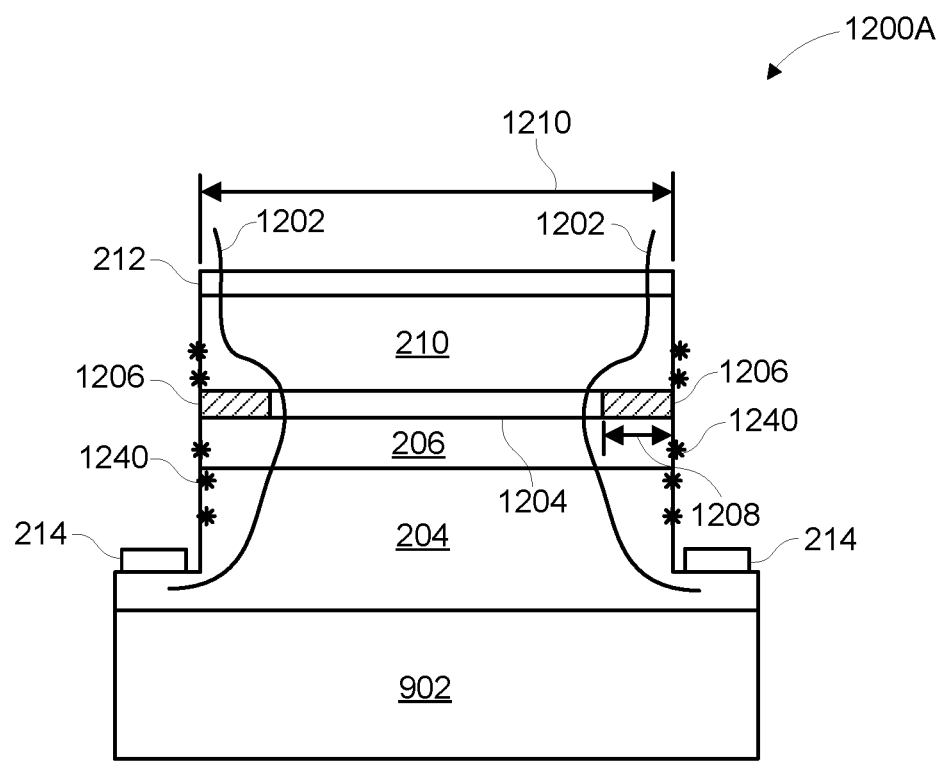
FIG. 12 depicts a cross-sectional view of carrier movement in accordance with some embodiments of the present principles.
Figure 12:
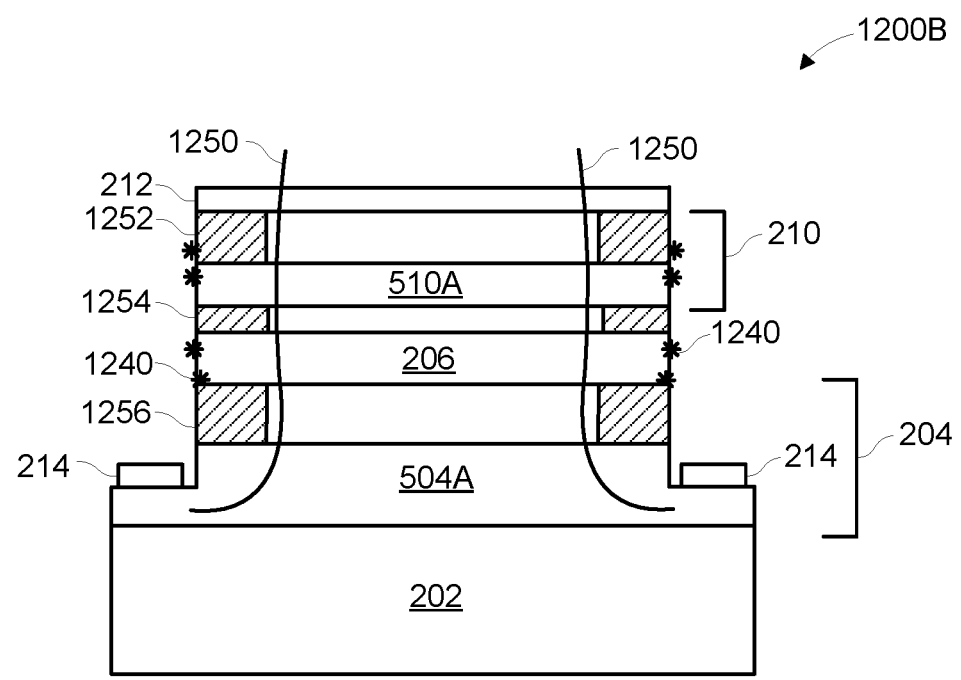

In a view 1200A of FIG. 12, a first sidewall restriction layer 1204 has been laterally oxidized in an outer portion 1206. Defects 1240 in the sidewalls caused during etching of the LED structure reduce the performance of the LED structure. Carriers have been restricted from the sidewalls and confined between the lines 1202 even with just a single sidewall restriction layer. In some embodiments, a total depth 1208 of lateral penetration of the oxidation including both sides may range from approximately 1% to approximately 7% of an overall layer width 1210 of the sidewall restriction layer. Lateral oxidation penetration on each side would be half of that value (approx. 0.5% to approx. 3.5%). In a view 1200B of FIG. 12, the carriers have been more thoroughly restricted from the sidewalls and confined between the lines 1250 to avoid the defects 1240 in the sidewalls. A first sidewall restriction layer 1252 (p-type superlattice structure with aluminum), a second sidewall restriction layer 1254 (electron blocking layer with aluminum), and a third sidewall restriction layer 1256 (n-type superlattice structure with aluminum) work in concert to keep the carriers away from the sidewalls. A fourth sidewall restriction layer (not shown) may also be incorporated below the quantum well layer 206. During the selective oxidation processes described previously, layers with aluminum-based materials will have some degree of lateral oxidation penetration and form a sidewall restriction layer. The rate of the penetration is dependent on the amount of or percentage of aluminum in the layer.

Figure 9:
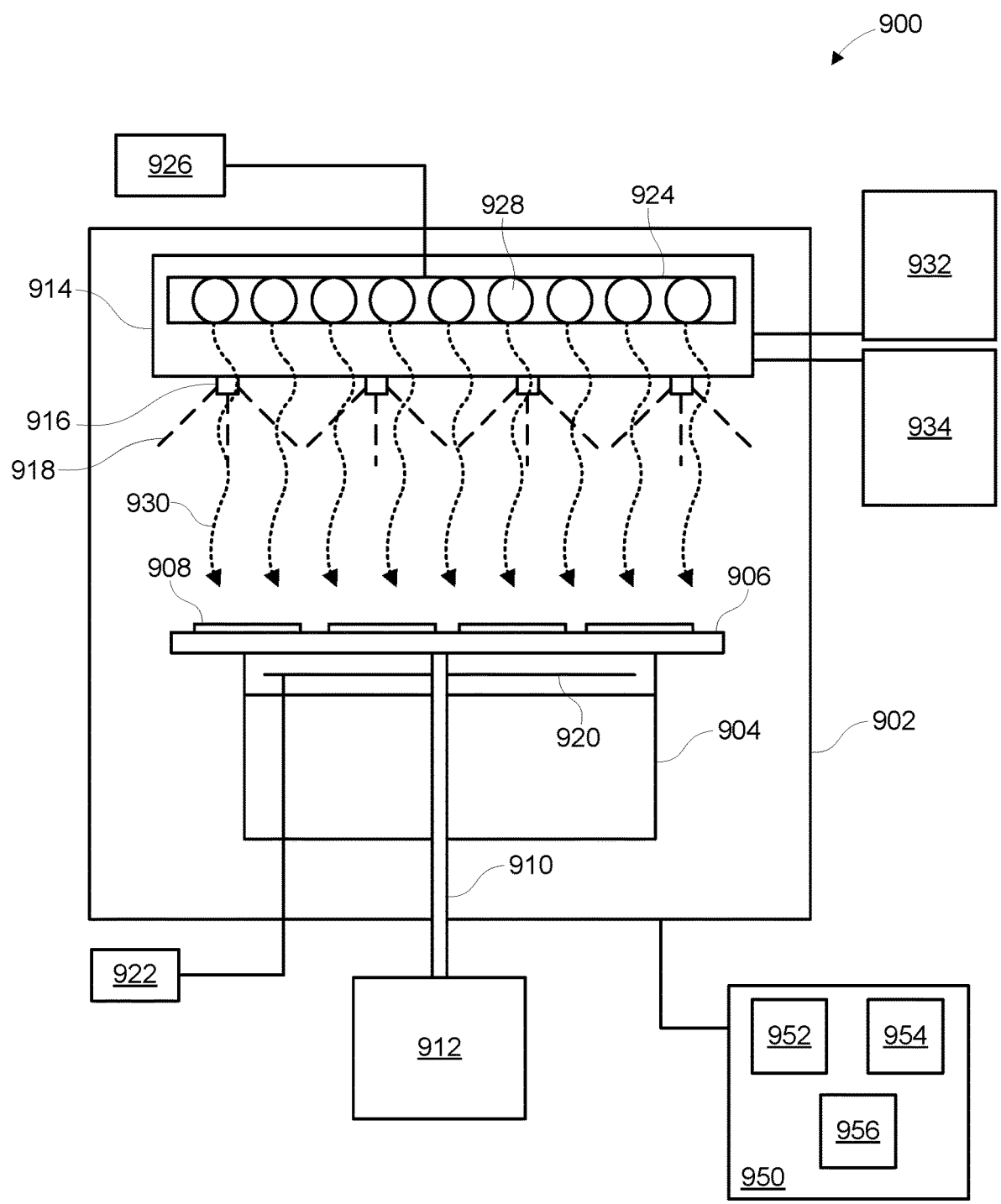
FIG. 9 depicts a cross-sectional view of a process chamber in which an LED structure undergoes an oxidation process in accordance with some embodiments of the present principles.
Figure 10:
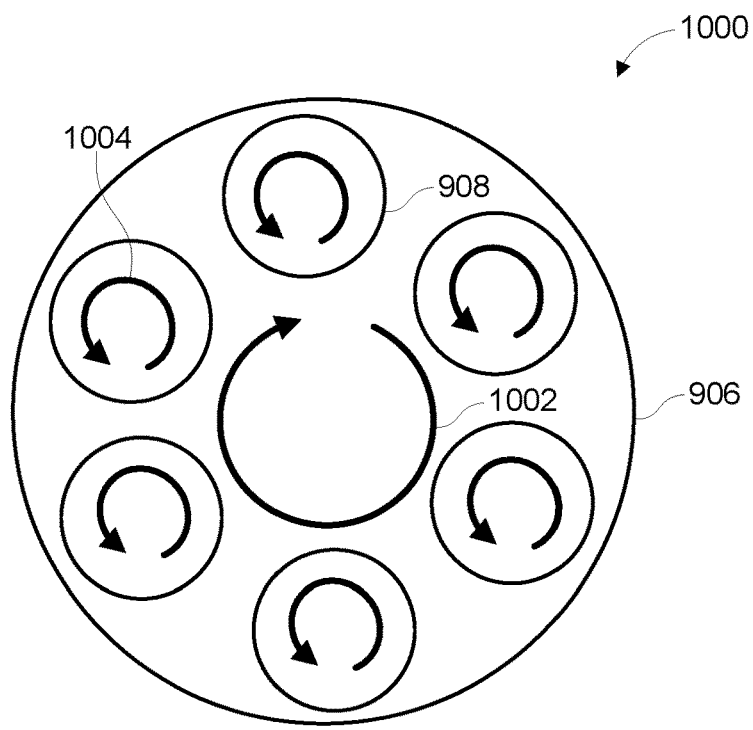
FIG. 10 depicts a top-down view of a carousel in accordance with some embodiments of the present principles.
Figure 11:
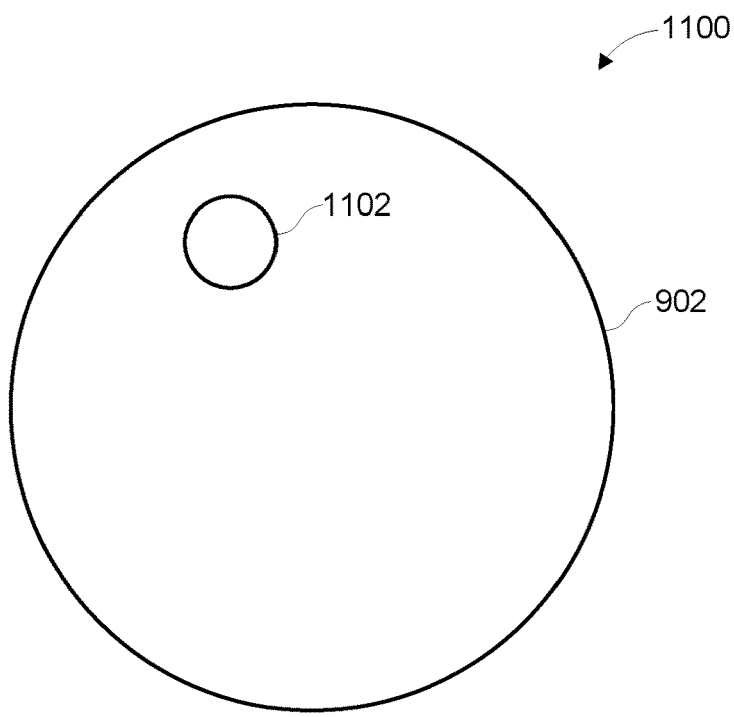
FIG. 11 depicts a top-down view of a process chamber in accordance with some embodiments of the present principles.

A heating chamber 902 or oxidation furnace in which the substrates according to method 100 may be oxidized is depicted in a view 900 of FIG. 9. Other chamber designs, including multi-level batch processing furnaces may also be used. The heating chamber 902 is one example and is not meant to be limiting in any manner. The heating chamber 902 has a substrate support 904 that supports a susceptor 906 that holds multiple substrates 908. The susceptor 906 is rotatable via a shaft 910 and actuator 912. As depicted in a view 1000 of FIG. 10, the susceptor 906 may rotate, for example, in a clockwise direction 1002 while the substrates 908 individually rotate in a counterclockwise direction 1004. The rotations of the substrates 908 and the susceptor 906 ensure a more complete and even oxidation of the sidewall restriction layers. The relevant direction of rotation is not meant to be limiting as long as the susceptor and substrates have opposite rotations. The heating chamber 902 may utilize a showerhead 914 to disperse water vapor 918 via nozzles 916. The water vapor 918 may originate from a water supply 934 fluidly connected to the showerhead 914. In some embodiments, the water vapor 918 may be present in a nitrogen gas ambient from an nitrogen gas supply 932. In some embodiments, the substrate support 904 may include heating electrodes 920 that are electrically heated via a heating power source 922.

In some embodiments, the substrates 908 and water vapor 918 may be heated by an overhead heating assembly 924 that includes a plurality of infrared heating bulbs 928 that produce radiated heat 930. The overhead heating assembly 924 is supplied by a heating assembly power source 926. As can be appreciated, other types of heating chambers such as microwave or other configurations such as side heating chambers or batch heating chambers may also be utilized. During the selective oxidation process, the oxidation penetration is monitored to assure that precise lateral penetration is achieved. In some embodiments, the oxidation monitoring may be achieved in-situ by using optical microscopy 1102 built into the heating chamber 902 as depicted in a view 1100 of FIG. 11. The LED structure is generally translucent to the wavelength of the light used while the oxidation produces a darker color which can be identified from above the substrate. When the selective oxidation penetration has reached an appropriate depth, the selective oxidation process may be stopped manually and/or automatically (such as by controller 950).

A controller 950 controls the operation of the heating chamber 902 using a direct control or alternatively, by controlling the computers (or controllers) associated with the heating chamber 902. In operation, the controller 950 enables data collection and selective oxidation penetration depth feedback to optimize performance of the heating chamber 902. The controller 950 generally includes a Central Processing Unit (CPU) 952, a memory 954, and a support circuit 956. The CPU 952 may be any form of a general-purpose computer processor that can be used in an industrial setting. The support circuit 956 is conventionally coupled to the CPU 952 and may comprise a cache, clock circuits, input/output subsystems, power supplies, and the like. Software routines, such as a method as described above may be stored in the memory 954 and, when executed by the CPU 952, transform the CPU 952 into a specific purpose computer (controller 950). The software routines may also be stored and/or executed by a second controller (not shown) that is located remotely from the heating chamber 902.

The memory 954 is in the form of computer-readable storage media that contains instructions, when executed by the CPU 952, to facilitate the operation of the semiconductor processes and equipment. The instructions in the memory 954 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a light emitting diode (LED), comprising:
    forming an n-type layer of the LED on a substrate;
    forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation;
    forming a quantum well layer of the LED on the substrate;
    forming a p-type layer of the LED on the substrate;
    exposing the substrate to water vapor in a nitrogen ambient for a duration of approximately 30 seconds to approximately 600 seconds; and
    heating the substrate to selectively oxidize at least an outer portion of the at least one sidewall restriction layer to increase a quantum efficiency of the LED.

2. The method of claim 1, further comprising:
    forming the p-type layer as a first superlattice including at least one first aluminum-based material layer; and
    selectively oxidizing at least a first outer portion of the at least one first aluminum-based material layer of the first superlattice to form a first one of the at least one sidewall restriction layer.

3. The method of claim 2, wherein the first superlattice includes at least one p-type aluminum indium nitride layer and at least one gallium nitride layer.

4. The method of claim 2, wherein the first superlattice includes at least one p-type aluminum gallium arsenide layer and at least one gallium arsenide layer.

5. The method of claim 1, further comprising:
    forming the n-type layer as a second superlattice including at least one second aluminum-based material layer; and
    selectively oxidizing at least a second outer portion of the at least one second aluminum-based material layer of the second superlattice to form a second one of the at least one sidewall restriction layer.

6. The method of claim 5, wherein the second superlattice includes at least one n-type aluminum indium nitride layer and at least one gallium nitride layer.

7. The method of claim 5, wherein the second superlattice includes at least one n-type aluminum gallium arsenide layer and at least one gallium arsenide layer.

8. The method of claim 1, wherein the quantum well layer incudes a multi-quantum well (MQW).

9. The method of claim 1, wherein the at least one sidewall restriction layer of an aluminum-based material is formed on the n-type layer.

10. The method of claim 1, wherein the at least one sidewall restriction layer of the aluminum-based material is formed on the quantum well layer and is additionally configured to function as an electron blocking layer.

11. The method of claim 1, further comprising:
    rotating the substrate while heating to improve oxidation of the at least one sidewall restriction layer.

12. The method of claim 11, further comprising:
    rotating the substrate and a susceptor that supports the substrate in opposite directions.

13. A method for forming a light emitting diode (LED), comprising:
    forming an n-type layer of the LED on a substrate;
    forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation;
    forming a quantum well layer of the LED on the substrate;
    forming a p-type layer of the LED on the substrate;
    exposing the substrate to water vapor in a nitrogen ambient for approximately 30 seconds to approximately 600 seconds; and
    heating the substrate to a temperature of approximately 500 degrees Celsius to approximately 800 degrees Celsius to selectively oxidize at least an outer portion of the at least one sidewall restriction layer to increase a quantum efficiency of the LED.

14. The method of claim 13, further comprising:
forming the p-type layer as a first superlattice including at least one first aluminum-based material layer; and
selectively oxidizing at least a first outer portion of the at least one first aluminum-based material layer of the first superlattice to form a first one of the at least one sidewall restriction layer.

15. The method of claim 14, wherein the first superlattice includes at least one p-type aluminum indium nitride layer and at least one gallium nitride layer or includes at least one p-type aluminum gallium arsenide layer and at least one gallium arsenide layer.

16. The method of claim 13, further comprising:
forming the n-type layer as a second superlattice including at least one second aluminum-based material layer; and
selectively oxidizing at least a second outer portion of the at least one second aluminum-based material layer of the second superlattice to form a second one of the at least one sidewall restriction layer.

17. The method of claim 16, wherein the second superlattice includes at least one n-type aluminum indium nitride layer and at least one gallium nitride layer or includes at least one n-type aluminum gallium arsenide layer and at least one gallium arsenide layer.

18. The method of claim 13, wherein the at least one sidewall restriction layer of an aluminum-based material is formed on the n-type layer or formed on the quantum well layer.

19. A non-transitory, computer readable medium having instructions stored thereon that, when executed, cause a method for forming a light emitting diode (LED) to be performed, the method comprising:
forming an n-type layer of the LED on a substrate;
forming at least one sidewall restriction layer of the LED on the substrate, wherein the at least one sidewall restriction layer is comprised of aluminum-based material and configured to redirect carriers within the LED away from etching defects in a sidewall of the LED after subsequent partial oxidation;
forming a quantum well layer of the LED on the substrate;
forming a p-type layer of the LED on the substrate;
exposing the substrate to water vapor in a nitrogen ambient for approximately 30 seconds to approximately 600 seconds; and
heating the substrate to a temperature of approximately 500 degrees Celsius to approximately 800 degrees Celsius to selectively oxidize at least an outer portion of the at least one sidewall restriction layer to increase a quantum efficiency of the LED.

20. The non-transitory, computer readable medium of claim 19, wherein the at least one sidewall restriction layer of the aluminum-based material is formed on the n-type layer or formed on the quantum well layer.

* * * * *